350-332 SR
XR 3,974,636 P4N
SEARCH ROOM

United Sta

Kamiya

SUBSTITUTE FOR MISSING XR

[11] 3,974,636
[45] Aug. 17, 1976

[54] BOOSTER CIRCUIT FOR A LIQUID CRYSTAL DISPLAY DEVICE OF A TIMEPIECE

[75] Inventor: Masaaki Kamiya, Matsudo, Japan

[73] Assignee: Kabushiki Kaisha Daini Seikosha, Japan

[22] Filed: Nov. 1, 1974

[21] Appl. No.: 520,352

[30] Foreign Application Priority Data

Nov. 8, 1973 Japan ........................ 48-129356[U]
Dec. 26, 1973 Japan ........................ 49-5348[U]

[52] U.S. Cl. ................................ 58/23 R; 330/112
[51] Int. Cl.[2] ........................ G04C 3/00; H03F 1/40
[58] Field of Search ........................ 58/23 BA, 50 R; 330/112

[56] References Cited

UNITED STATES PATENTS 3,100,278 8/1963 Reich ............................ 58/23 A X
3,225,536 12/1965 Reich ............................ 58/23 A
3,782,103 1/1974 Saito ............................ 58/23 BA

*Primary Examiner*—Edith Simmons Jackmon
*Attorney, Agent, or Firm*—Robert E. Burns; Emmanual J. Lobato; Bruce L. Adams

[57] ABSTRACT

A booster circuit for a liquid crystal display device of a timepiece is disclosed. The booster circuit is a sort of a blocking oscillator having a transformer of which turns ratio is 1 : n (where *n* is a real number). The rectified output voltage of said blocking oscillator is superposed on the voltage of the cell so that the output voltage of the booster circuit is higher than of the blocking oscillator. A smoothing condenser has ample capacitance to have a larger time constant than the fluctuation time of the voltage of the cell owing to mechanical shock.

3 Claims, 7 Drawing Figures

BOOSTER CIRCUIT FOR A LIQUID CRYSTAL DISPLAY DEVICE OF A TIMEPIECE

BACKGROUND OF THE INVENTION

This invention relates to a booster circuit for a liquid crystal display device of a timepiece.

A conventional watch having a liquid crystal display device is shown schematically in FIG. 1. Output signals from a quartz crystal oscillator 1 are fed to a driving circuit 2, and a liquid crystal display device 3 is driven by the driving circuit 2 and shows the corresponding time.

Direct current voltages from a direct current source 4 and a DC - DC converter 5 are fed to the driving circuit 2. In the DC - DC converter 5, direct current voltage from the source 4 is changed to a pulse voltage, after it is boosted at some value of voltage, it is changed to direct current voltage by the rectifier circuit.

In a small size watch having a liquid crystal display device, particularly in a wrist watch, it is preferable to incorporate a small size cell having a long life. For satisfying this need, a silver oxide cell having a 1.5 V terminal voltage has been used, however, it is not sufficient to drive a liquid crystal display device directly. Then some kind of booster, such as a DC - DC converter shown in FIG. 1, must be incorporated into a watch together with a cell.

For example, a circuit shown in FIG. 2 is used as a DC - DC converter. It is called a blocking oscillator and consists of a transformer T of which the winding ratio is 1 : 1, a condenser $C_1$, a resistor $R_1$ and a transistor $Q_1$. The DC voltage is changed into a pulse voltage by this blocking oscillator.

A cubic winding $T_3$ of which the winding ratio is *n* times that of a secondary winding $T_2$ is disposed together with the secondary winding $T_2$. A pulse induced on the second winding $T_2$ is boosted by the cubic winding $T_3$ and is rectified by a rectifier circuit having a diode $D_1$ and a smoothing condenser Co. Then *n* times the DC voltage of a direct current source 4, for example six volt, appears between output terminals $t_1$ and $t_2$.

The construction of the DC - DC converter is such that a transformer having three windings is required. Because of this, it is very difficult to get a small size watch having a liquid crystal display device. Furthermore, since three coils are incorporated into the converter, the connection of terminals is very troublesome, and to make matters worse, conversion efficiency is lowered. Then the cell is exhausted so much earlier.

In an electronic watch, voltage fluctuation of the power source happens to occur by instantaneous disconnection between a cell and a connecting electrode owing to mechanical shock.

If the capacitance of the smoothing condenser Co is relatively small compared with the power consumption of the load resistance (logic circuit), the output voltage of said booster circuit would promptly be dropped. If this voltage drop is to large, the memory of the logic circuit would be lost.

When this voltage is recovered after that, and sufficient power is supplied to the logic circuit, but the memory of said logic circuit is not recovered. Because of this, display time of the watch gets out of order, and adjustment of the display time is requested.

SUMMARY OF THE INVENTION

An object of this invention is to provide a small size booster circuit which is available for a liquid crystal display device of a timepiece.

Another object of this invention is to lessen the number of coils and to lessen the winding ratio of the secondary coil.

A further object of the invention is to lessen power consumption of a cell improving conversion efficiency.

A still further object of the invention is to provide a booster circuit incorporating a smoothing condenser having sufficient capacity which is not affected by voltage fluctuation of the power supply.

According to this invention, a blocking oscillator having a transformer of which the turns ratio is 1 : *n* is incorporated into the converter. The voltage of the cell is fed to the output terminal of the converter, and the output signals of the blocking oscillator are superposed on the voltage of the cell.

And even if the voltage of power supply is fluctuated by intermittent contact between the cell and the connecting electrode, output voltage of the booster circuit is not affected by this voltage fluctuation. Namely, the logic circuit, the load of the booster circuit, is not affected by fluctuation of the voltage of the power supply.

The novel features of the present invention, both as to its organization and method of operation, as well as additional objects and advantages thereof, will be more readily understood from the following description, when read in connection with the accompanying drawings, in which similar reference characters designate similar parts throughout.

DESCRIPTION OF THE PREFERRED EMBODIMENTS

Figure 1:
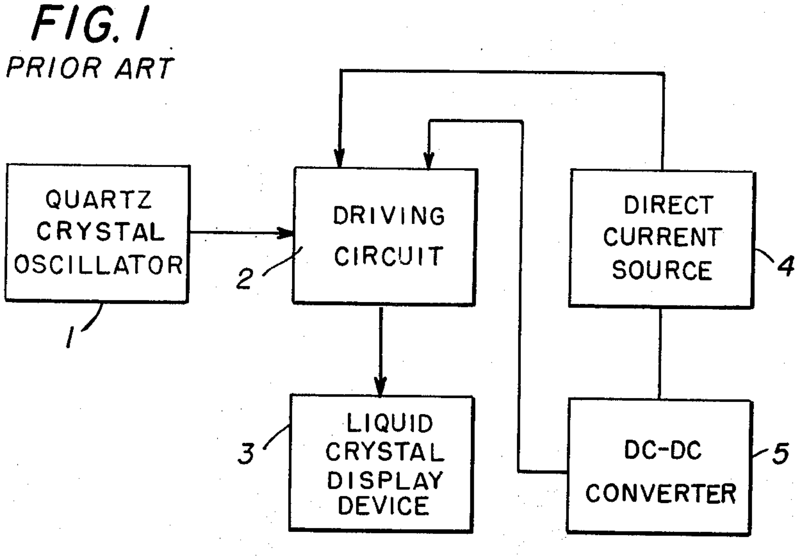
FIG. 1 PRIOR ART
FIG. 1 shows a block diagram of a conventional watch having a liquid crystal display device.
Figure 2:
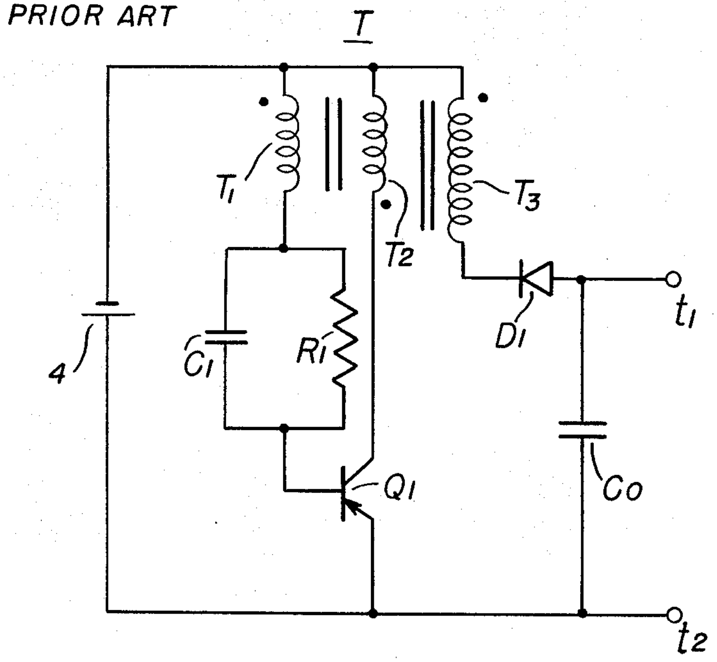
FIG. 2 PRIOR ART
FIG. 2 shows a conventional DC - DC converter which is incorporated into a watch shown in FIG. 1.
Figure 3:
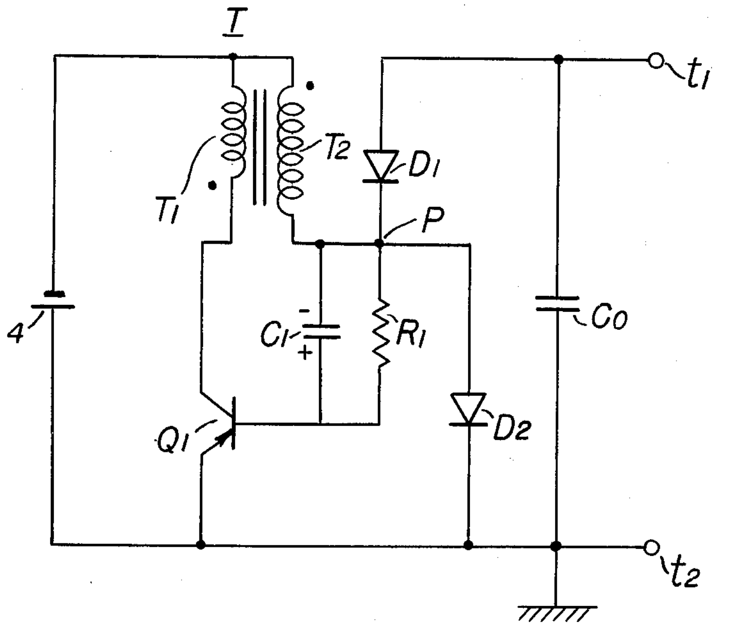
FIG. 3 shows an embodiment of the booster circuit according to this invention.

Referring to FIG. 3, the embodiment of this invention is explained, in which the same reference characters designate the same parts which are shown in FIG. 2.

Reference numeral 4 designates a DC power source, for example, it is a silver oxide cell having an output voltage of 1.5 V. The positive electrode of the cell 4 is connected to the output terminal $t_2$ which is an earth or grounded terminal. The negative electrode of the cell 4 is connected to the collector of a transistor $Q_1$ via a primary winding $T_1$ of the transformer T.

The transformer T has a primary winding $T_1$ and a secondary the turns $T_2$ of which winding ratio is 1 : *n* (where *n* is a real number). That is to say, the number of turns of the secondary winding $T_2$ are *n* times the number of turns of the primary winding $T_1$ so that the induced voltage of the secondary winding $T_2$ has $n$ times the valve of that of the primary winding $T_1$.

The emitter of the transistor $Q_1$ is connected to the earth terminal and its base is connected to the negative electrode of the cell 4 via a time constant circuit having a condenser $C_1$ and a resistor $R_1$, and a secondary winding $T_2$ of the transformer T.

The time constant circuit, the transistor $Q_1$ and the transformer T construct a blocking oscillator, and the point P of the blocking oscillator is connected to an output terminal $t_1$ via diode $D_1$.

A condenser Co is connected between the output terminals $t_1$ and $t_2$, and a rectifier circuit is made by said diode $D_1$ and said condenser Co. Another diode $D_2$ is connected between the point P and the earth terminal. This is effective to cut back electromotive force which appears at the end of the oscillating signal.

The construction of the booster is such that it works as follows.

DC voltage of the cell 4 is fed to the output terminal $t_1$ via the second winding $T_2$ of the transformer T and the diode $D_1$. The polarization of primary winding $T_1$ and secondary winding $T_2$ of the transformer T is shown by dots ".".

When the collector current of the transistor $Q_1$ flows, an induced voltage appears on the secondary winding $T_2$. Then a large amount of base current flows and the condenser $C_1$ is charged for the polarity shown in FIG. 3. Because of this, the potential of the base assumes a state of cut off, and the collector current is cut off.

When the collector current is cut off, the charge of the condenser $C_1$ is discharged through the resistor $R_1$ and the charged voltage of the condenser $C_1$ is lowered. When this charged voltage is lowered under the cut off voltage between the base and the emitter, collector current begins to flow again. Then the base current is also increased, and the condenser $C_1$ is charged again.

This charge and discharge is automatically repeated, and pulse voltage of which cycle the time is defined by time constant of the condenser $C_1$ and resistor $R_1$ appears on the second winding $T_2$ of the transformer. Since the transformer has only two coils of which the turns ratio is $1 : n$, the value of the inductance of the transformer is high enough to lower the power consumption of the cell 4. The voltage value induced on the secondary winding $T_2$ is $n$ times the value of the voltage which is fed on the primary turns $T_1$. (For example, if the winding ratio is 1 : 3, the voltage value induced on the secondary winding is 4.5V.)

Figure 4:
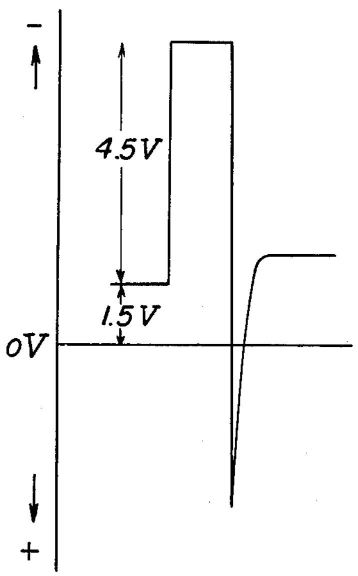
FIG. 4 shows a wave form which is boosted but is not rectified.

This 4.5 V voltage is superposed on 1.5 V DC voltage and it is added between the point P and the output terminal $t_2$. The superposed voltage is rectified by the diode $D_1$ and is smoothed by the condenser $C_2$. Then the boosting voltage shown in FIG. 4 is fed between the output terminals $t_1$ and $t_2$. (It is understood that the boosting voltage is approximately 6 V.)

That is to say, the voltage of the boosting voltage which appears at the output terminals $t_1$ and $t_2$ is substantially the sum of the voltage of the DC cell and the rectified voltage of the output of the blocking oscillator.

Figure 5:
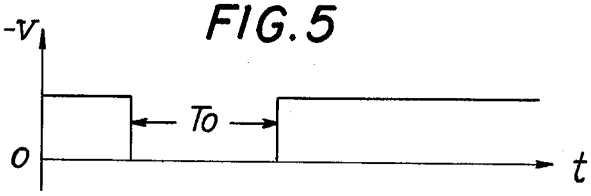
FIG. 5 shows voltage fluctuation of a cell.
Figure 6:
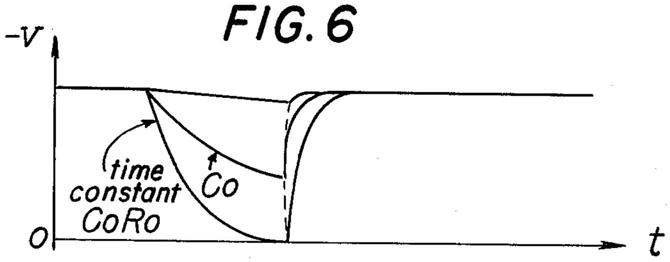
FIG. 6 shows output voltage fluctuation of the booster circuit.

Voltage fluctuation may occur by mechanical shock. This voltage fluctuation is caused by intermittence between the cell 4 and its connecting electrode (not shown). FIG. 5 shows a voltage fluctuation which has occurred at the input of the booster and FIG. 6 shows a voltage fluctuation which has occurred at the output of the booster. If the voltage fluctuation period is longer than the time constant CoRo, the output voltage of the booster circuit is deeply dropped along the curve of time constant CoRo, where Co is the capacitance of the smoothing condenser 6 and Ro is equivalent resistance of the load.

It is understood from this figure that the capacitance of the smoothing condenser Co will be determined to have sufficient attenuation time more than the longest voltage fluctuation time To.

Figure 7:
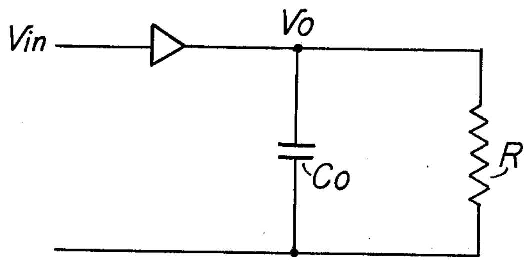
FIG. 7 shows rectifier circuit according to this invention.

FIG. 7 shows rectifier circuit according to this invention. Suppose that the equivalent load resistance R of the booster circuit is 5 MΩ and the cycle time of the blocking oscillator is 100 $\mu$ sec. when input voltage (Vin) is rectified and DC output voltage Vo appears. If the connection between the cell 4 and the booster circuit is not cut off, following condition would be satisfied.

$$5 \times 10^6 \times Co >> 100 \times 10^{-6} \text{ (sec)}$$

therefore, $$Co >> 20 \text{ PF}$$

This means that capacitance of the smoothing condenser must be sufficiently larger than 20 PF. Then, if said capacitance is defined to the value of 200 PF (10 times of 20 PF), low rippled DC output voltage may be available.

When the connection between the cell 4 and the booster circuit is cut off during 10msec shown in FIG. 5, if said capacitance Co is 200 PF, the value of time constant CoR would be 1 msec. Then the output voltage Vo has completely been attenuated.

Considering this disconnection of power supply, $$5 \times 10^6 \times Co >> 10 \times 10^{-3} \text{ (sec)}$$

therefore, $$Co >> 200 \text{ PF}$$

Capacitance of the smoothing condenser must be sufficiently larger than 20000 PF (10 times of 2000 PF).

While a preferred embodiment of the invention has been shown and described it will be understood that many modifications and changes can be made within the true spirit and scope of the invention.

I claim:

1. A booster circuit for a liquid crystal display device of a timepiece comprizing, a direct current source, a blocking oscillator having a transformer of which the turns rato is $1 : n$ (where $n$ is a real number), and a rectifier circuit for rectifying the oscillator output voltage; wherein the secondary winding of said transformer is connected between the output of said blocking oscillator and said source to superpose the blocking oscillator output voltage on the voltage of said direct current source.

2. A booster circuit for a liquid crystal display device of a timepiece according to claim 1, wherein said rectifier circuit includes a smoothing condenser having sufficient capacitance to render the time constant of said rectifier circuit larger than a fluctuation time of the voltage of said direct current source caused by mechanical shock to said source.

3. A voltage booster circuit, comprizing:

a transistor having a pair of principal conduction electrodes and a control electrode;

a transformer having a primary winding and a secondary winding with a turns ratio of 1 : *n* (where *n* is a real number), wherein one side of the primary winding is connected to one of said principal conduction electrodes, and wherein the other side of said primary winding is connected to the one side of the secondary winding opposed in polarity to said other side of said primary winding;

a resistor and a capacitor connected in parallel, wherein the parallel combination of said resistor and capacitor is connected between said control electrode of said transistor and the other said of side secondary winding and defining a junction therewith;

a pair of diodes connected to the junction defined by said secondary winding and said parallel combination, wherein said diodes have opposite relative polarities relative to the junction; and a filter capacitor connected between the respective sides of said pair of diodes remote from the junction to which said pair of diodes are connected.

* * * * *